United States Patent
Yu et al.

(10) Patent No.: US 9,818,484 B2
(45) Date of Patent: Nov. 14, 2017

(54) SYSTEMS, METHODS, AND APPARATUS FOR MEMORY CELLS WITH COMMON SOURCE LINES

(71) Applicant: Cypress Semiconductor Corporation, San Jose, CA (US)

(72) Inventors: Xiaojun Yu, Shanghai (CN); Venkatraman Prabhakar, Pleasanton, CA (US); Igor G. Kouznetsov, San Francisco, CA (US); Long T Hinh, San Jose, CA (US); Bo Jin, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/466,593

(22) Filed: Mar. 22, 2017

(65) Prior Publication Data

US 2017/0278573 A1    Sep. 28, 2017

Related U.S. Application Data

(63) Continuation of application No. 15/271,028, filed on Sep. 20, 2016, now Pat. No. 9,627,073, which is a
(Continued)

(51) Int. Cl.
  *G11C 16/04* (2006.01)
  *G11C 16/10* (2006.01)
  (Continued)

(52) U.S. Cl.
  CPC .......... *G11C 16/10* (2013.01); *G11C 16/0466* (2013.01); *G11C 16/08* (2013.01); *G11C 16/14* (2013.01); *G11C 16/26* (2013.01)

(58) Field of Classification Search
  CPC .... G11C 2213/75; G11C 11/4097; G11C 8/12
  See application file for complete search history.

(56) References Cited

U.S. PATENT DOCUMENTS 5,455,792 A * 10/1995 Yi ...................... H01L 29/7885
                                                              257/316
5,812,454 A     9/1998 Choi
(Continued)

FOREIGN PATENT DOCUMENTS

CN            103137194 A        6/2013

OTHER PUBLICATIONS

International Search Report for International Application No. PCT/US14/64382 dated Dec. 10, 2014; 3 pages.
(Continued)

*Primary Examiner* — Tuan T Nguyen (57) ABSTRACT

Systems, methods, and apparatus are disclosed for implementing memory cells having common source lines. The methods may include receiving a first voltage at a first transistor. The first transistor may be coupled to a second transistor and included in a first memory cell. The methods include receiving a second voltage at a third transistor. The third transistor may be coupled to a fourth transistor and included in a second memory cell. The first and second memory cells may be coupled to a common source line. The methods include receiving a third voltage at a gate of the second transistor and a gate of the fourth transistor that may cause them to operate in cutoff mode. The methods may include receiving a fourth voltage at a gate of the first transistor. The fourth voltage may cause a change in a charge storage layer included in the first transistor.

5 Claims, 10 Drawing Sheets

Related U.S. Application Data continuation of application No. 14/618,815, filed on Feb. 10, 2015, now Pat. No. 9,466,374, which is a continuation of application No. 14/316,615, filed on Jun. 26, 2014, now Pat. No. 8,953,380.

(60) Provisional application No. 61/910,764, filed on Dec. 2, 2013.

(51) Int. Cl.
  G11C 16/14 (2006.01)
  G11C 16/26 (2006.01)
  G11C 16/08 (2006.01)

(56) References Cited

U.S. PATENT DOCUMENTS

| | | | |
|---|---|---|---|
| 6,222,774 B1* | 4/2001 | Tanzawa | G11C 16/08 365/185.2 |
| 6,614,684 B1 | 9/2003 | Shukuri et al. | |
| 6,847,556 B2 | 1/2005 | Cho | |
| 6,894,924 B2 | 5/2005 | Choi et al. | |
| 7,319,616 B2 | 1/2008 | Sundaram et al. | |
| 7,693,004 B2 | 4/2010 | Tsukude | |
| 7,859,904 B1 | 12/2010 | Jenne et al. | |
| 8,072,790 B2 | 12/2011 | Kim | |
| 8,081,499 B2 | 12/2011 | Takahashi et al. | |
| 8,120,095 B2 | 2/2012 | Ho et al. | |
| 8,295,099 B1 | 10/2012 | Yachareni et al. | |
| 8,331,150 B2 | 12/2012 | Hsu et al. | |
| 8,339,862 B2* | 12/2012 | Aiika | G11C 16/0483 257/324 |
| 8,363,469 B1 | 1/2013 | Poplevine et al. | |
| 8,432,742 B2 | 4/2013 | Jeong et al. | |
| 8,482,057 B2 | 7/2013 | Yeh | |
| 8,531,885 B2 | 9/2013 | Hsu et al. | |
| 8,542,514 B1 | 9/2013 | Lakshminarayanan et al. | |
| 8,724,390 B2 | 5/2014 | Hung et al. | |
| 8,750,018 B2 | 6/2014 | Youn et al. | |
| 8,908,418 B2 | 12/2014 | Yabuuchi | |
| 8,953,380 B1 | 2/2015 | Yu et al. | |
| 9,466,374 B2 | 10/2016 | Yu et al. | |
| 2005/0030827 A1 | 2/2005 | Gilliland et al. | |
| 2005/0105334 A1* | 5/2005 | Futatsuyama | G11C 16/3418 365/185.17 |
| 2008/0074927 A1* | 3/2008 | Hofmann | G11C 16/0483 365/185.17 |
| 2009/0086538 A1 | 4/2009 | Jenne et al. | |
| 2009/0268527 A1 | 10/2009 | Duuren et al. | |
| 2010/0322011 A1 | 12/2010 | Edahiro | |
| 2012/0044772 A1 | 2/2012 | Jeon et al. | |
| 2014/0063951 A1* | 3/2014 | Choi | G11C 16/0483 365/185.11 |
| 2014/0219024 A1* | 8/2014 | Ogi | G11C 16/10 365/185.11 |
| 2015/0003151 A1* | 1/2015 | Lee | G11C 16/10 365/185.02 |
| 2016/0099047 A1* | 4/2016 | Lee | G11C 7/1039 365/185.03 |

OTHER PUBLICATIONS

Kim, Byungcheul, "A Scaled SONOS Single-Transistor Memory Cell for a High-Density NOR Structure with Common Source Lines," Journal of the Korean Physical Society, vol. 41, No. 6, Dec. 2002, pp. 945-948; 4 pages.

Saha, S.K., "Design Considerations for Sub-90-nm Split-Gate Flash-Memory Cells," IEEE Transactions on Electron Devices, vol. 54, Issue: 11, Nov. 2007, pp. 3049-3055.

USPTO Non-Final Rejection for U.S. Appl. No. 14/618,815 dated Sep. 29, 2015; 5 pages.

USPTO Notice of Allowance for U.S. Appl. No. 14/316,615 dated Jan. 15, 2015; 2 pages.

USPTO Notice of Allowance for U.S. Appl. No. 14/316,615 dated Dec. 1, 2014; 8 pages.

USPTO Notice of Allowance for U.S. Appl. No. 14/618,815 dated Jun. 9, 2016; 5 pages.

USPTO Notice of Allowance for U.S. Appl. No. 14/618,815 dated Dec. 11, 2015; 7 pages.

USPTO Notice of Allowance for U.S. Appl. No. 15/271,028 dated Dec. 13, 2016; 7 pages.

Written Opinion of the International Searching Authority for International Application No. PCT/US14/64382 dated Dec. 10, 2014; 3 pages.

* cited by examiner

SYSTEMS, METHODS, AND APPARATUS FOR MEMORY CELLS WITH COMMON SOURCE LINES

CROSS-REFERENCE TO RELATED APPLICATIONS

This application is a continuation of U.S. patent application Ser. No. 15/271,028, filed Sep. 20, 2016, which is a continuation of U.S. patent application Ser. No. 14/618,815, filed Feb. 10, 2015, now U.S. Pat. No. 9,466,374, issued Oct. 11, 2016, which is a continuation of U.S. patent application Ser. No. 14/316,615, filed Jun. 26, 2014, now U.S. Pat. No. 8,953,380, issued Feb. 10, 2015, which claims the benefit under 35 U.S.C. §119(e) of U.S. Provisional Patent Application No. 61/910,764, filed on Dec. 2, 2013, all of which are incorporated by reference herein in their entirety.

TECHNICAL FIELD

This disclosure generally relates to memory cells and, more specifically, to memory cells having common source lines.

BACKGROUND

Non-volatile memory devices are currently in widespread use in electronic components that require the retention of information when electrical power is unavailable or has been terminated. Non-volatile memory devices may include read-only-memory (ROM), programmable-read-only memory (PROM), erasable-programmable-read-only memory (EPROM), and electrically-erasable-programmable-read-only-memory (EEPROM) devices. Some memory arrays today utilize transistors and gate structures which may include a memory element or charge storage layer. The charge storage layer may be programmed to store data based on voltages applied to or received by the memory array.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Memory arrays may be implemented that utilize transistors and gate structures which may include a memory element or charge storage layer. The charge storage layer may be programmed to store data based on voltages applied to or received by the memory array. In this way, a memory array may include various different memory cells arranged in rows and columns, and each may be capable of storing at least one data value. Voltages may be applied to each of the memory cells to program them, erase them, or read one or more data values stored by them.

Conventional methods and techniques for implementing memory cells in memory cell arrays often rely on relatively large layouts to accommodate additional source lines that may be included in conventional layouts. For example, some conventional layouts may include dedicated source lines in which each column of memory cells is provided its own source line to bias or apply a voltage to a particular portion of the memory cell. Such layouts require a large foot print for each memory cell due to the additional metal that must be incorporated into the layout for the source lines. Accordingly, such conventional layouts are not suitable for small-area applications, as may be used in current flash memories. For example, a width of the dedicated source line may be relatively large when compared to small area memory cell layouts due to metal pitch rules associated with a fabrication process used to create the memory cells. Thus, the inclusion of a dedicated source line may preclude the use of such layouts in small-area applications.

Moreover, some conventional methods utilize programming modes, such as a channel hot electron programming mode, to program the memory cells. However, such conventional methods often require relatively large voltages to be applied, which may be in excess of 14V, thus making them unsuitable for low-voltage small area applications. Moreover, such conventional programming methods are not very durable and may limit the endurance or program/erase cycling of the cell due to damage that results from the use of such high voltages and currents.

Various systems, methods, and apparatus are disclosed herein that implement memory cells having common source lines while utilizing a Fowler-Nordheim programming technique. The utilization of a Fowler-Nordheim programming technique enables the use of lower voltages, thus enabling a relatively low-power operation of the memory cell and increased longevity. In addition, a Fowler-Nordheim technique reduces the current used during programming of a memory cell, thus allowing low power programming as well as enabling a large number of cells to be programmed at once. Moreover, a common source line may be implemented along with the memory cells. The use of a common source line results in a significantly smaller (up to 50%) footprint of each memory cell, thus enabling small area implementations of the memory cells. Furthermore, as described in greater detail below, the application of one or more voltages during the programming process may ensure that the conductive pathway formed by the common source line and leakage currents associated with that conductive pathway do not interfere with the Fowler-Nordheim programming technique.

Figure 1:
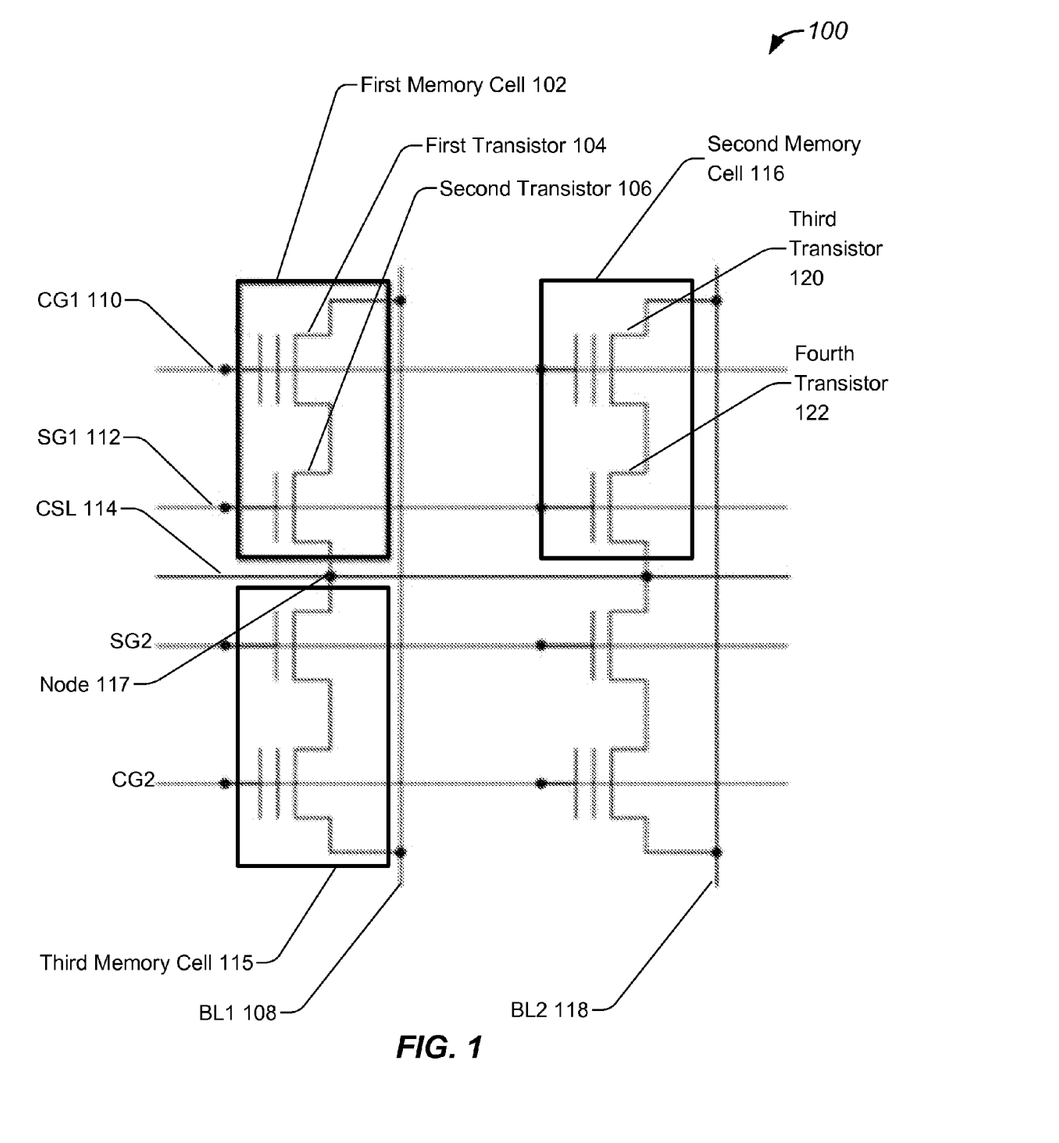
FIG. 1 illustrates a diagram of an example of a memory device, implemented in accordance with some embodiments.

FIG. 1 illustrates a diagram of an example of a memory device, implemented in accordance with some embodiments. A memory device, such as memory device 100 may be a storage device configured to store data values in various low-power and non-volatile contexts. For example, memory device 100 may be included in a small area flash memory which may be implemented in devices or systems such as smart cards and bank cards. Accordingly, memory devices as disclosed herein, such as memory device 100, may be implemented that have a relatively small area which may be fabricated using advanced processing nodes, such as a 65 nm node or lower. Moreover, as discussed in greater detail below, memory devices such as memory device 100 may include various memory cells configured to store data values. The memory cells may be implemented with a common source line, thus reducing the overall footprint of each memory cell, and may also be compatible with Fowler-Nordheim programming techniques. In this way, memory devices such as memory device 100 may be implemented in small area applications while also maintaining low-power programming functionality.

Accordingly, memory device 100 may include various memory cells, such as first memory cell 102. In various embodiments, first memory cell 102 may be configured to store or retain one or more data values based on one or more voltages applied to various portions of first memory cell 102. For example, first memory cell 102 may include transistors which may be configured to store one or more data values responsive to voltages applied to terminals or gates of the transistors. Thus, first memory cell 102 may include first transistor 104 and second transistor 106 which may be coupled in series. According to some embodiments, first transistor 104 may include at least one memory element which may be configured to change electrical characteristics based on voltages applied to terminals and gates of first transistor 104 and second transistor 106. For example, as discussed in greater detail below, when positively biased, electrons may tunnel through the material of the memory element and be retained within the material of the memory element, thus raising a threshold voltage associated with first transistor 104. In this way, the electrical characteristics of the memory element or charge storage layer may be indicative of a data value stored by first memory cell 102.

According to various embodiments, first transistor 104 may be configured to change electrical characteristics using a Fowler-Nordheim technique. In this way, the use of Fowler-Nordheim tunneling during programming of first transistor 104 may enable the use of lower biasing voltages and may further enable a low-power mode of operation when contrasted with conventional techniques. In various embodiments, a difference in a voltage applied to a gate of first transistor 104 and a bit line coupled to a drain or p-well of first transistor 104 may be between about 4V and 12V. More specifically, the difference in voltage may be between about 6V and 9V. For example, the difference may be about 7.5V. Additional details of programming, erase, and read operations associated with memory cells are discussed in greater detail below with reference to FIGS. 7-9.

In various embodiments, first transistor 104 may be a silicon-oxide-nitride-oxide-silicon (SONOS) type transistor. Thus, the memory element or charge storage layer included in first transistor 104 may be a nitride layer, such as a layer of silicon nitride. Moreover, the charge storage layer may also include other charge trap materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, and a high-K layer. Accordingly, the nitride that may be included in first transistor 104 may be configured to reversibly trap or retain carriers injected from a channel included in first transistor 104, and may consequently have one or more electrical characteristics reversibly changed, modified, or altered based on voltages applied to first memory cell 102.

As discussed above, first memory cell 102 may also include second transistor 106 which may be coupled in series with first transistor 104. In various embodiments, second transistor 106 may be an n-channel metal-oxide-semiconductor (NMOS) field-effect transistor that may be configured as a select transistor. Accordingly, a bias or voltage applied to a gate of second transistor 106 may effectively select or enable first memory cell 102 for an operation, such as a programming, erase, or read operation. In various embodiments, a voltage applied to the gate of second transistor 106, as well as fourth transistor 122 discussed in greater detail below, may cause second transistor 106 and fourth transistor 122 to be in an "off" state, or operate in a cutoff mode. When configured in this way, a leakage current associated with second transistor 106 and fourth transistor 122 may be minimized, and the appropriate potential or voltage difference utilized to program first transistor 104 may be maintained thus enabling the use of a Fowler-Nordheim programming technique.

In some embodiments, various physical characteristics of the select transistors, such as second transistor 106 and fourth transistor 122, may also be configured to minimize a leakage current. According to various embodiments, the select transistors may be configured to have longer channel lengths. For example, the select transistors may have a channel length of between about 25 nm and 180 nm. In one example, the select transistors may have a channel length of about 110 nm. Furthermore, according to some embodiments, the select transistors may have shorter channel lengths and other characteristics, such as junction depth, may be configured to reduce short channel effects.

According to various embodiments, memory device 100 may include various electrical pathways or lines which may be configured to provide one or more voltages to memory cells included within memory device 100. For example, memory device 100 may include first bit line 108, third line 110, fourth line 112, common source line 114, and second bit line 118. In various embodiments, first bit line 108 may be a bit line (BL1) that is coupled to a drain or a p-well of first transistor 104. First bit line 108 may also be coupled to a voltage source which may be included in or may be external to memory device 100. Accordingly, a voltage may be applied to the drain of first transistor 104 via first bit line 108. Similarly, first bit line 108 may be coupled to the drain or p-well of transistors included in other memory cells included in a column of memory cells that includes first memory cell 102. For example, first bit line 108 may also be coupled to a transistor of third memory cell 115. Furthermore, memory device 100 may include additional bit lines for each column of memory cells included in memory device 100. For example, memory device 100 may include second bit line 118 (BL2) coupled to a drain of third transistor 120 included in second memory cell 116 which may be in a different column than first memory cell 102.

Memory device 100 may further include third line 110 and fourth line 112 which may be coupled to the gates of transistors included in first memory cell 102. Third line 110 and fourth line 112 may also be coupled to a voltage source and may be configured to apply one or more voltages to the gates of the transistors included in first memory cell 102. For example, third line 110 may be a control gate line (CG1) configured to provide a first voltage to the gate of first transistor 104, and fourth line 112 may be a select gate line (SG1) configured to provide a second voltage to second transistor 106. Similarly, third line 110 and fourth line 112 may be coupled to gates of transistors in other memory cells included in the row of memory cells that includes first memory cell 102. For example, third line 110 may also be coupled to the gate of third transistor 120, and fourth line 112 may also be coupled to the gate of fourth transistor 122.

Further still, memory device 100 may include one or more common source lines (CSL) which may be coupled to source terminals of transistors included in memory cells of memory device 100. For example, common source line 114 may be coupled to a source terminal of second transistor 106. Furthermore, common source line 114 may be coupled to a voltage source and may be configured to provide a voltage to the source terminal of second transistor 106. Additionally, common source line 114 may be coupled to other memory cells included in the row of memory cells that includes first memory cell 102. For example, common source line 114 may also be coupled to a source terminal of a transistor included in second memory cell 116 as well as any or all other memory cells included in the row. In this way, several or all memory cells included in a row of memory cells may share a common source line. In various embodiments, implementing the source line in this way significantly reduces the footprint of each memory cell when contrasted with conventional techniques which may use a dedicated source line. Furthermore, common source line 114 may also be coupled to a source terminal of an adjacent row of memory cells. For example, common source line 114 may also be coupled to a source terminal of a transistor included in third memory cell 115 at node 117. In this way, a footprint associated with memory device 100 may be further reduced. Furthermore, according to some embodiments, common source line 114 may be coupled to a voltage source which may be configured to apply a voltage to common source line 114 during one or more operations, such as a programming operation. In various embodiments, the application of a voltage to common source line 114 may further reduce a leakage current associated with second transistor 106 during a programming operation, and may further facilitate the use of a Fowler-Nordheim tunneling programming technique.

Figure 2:
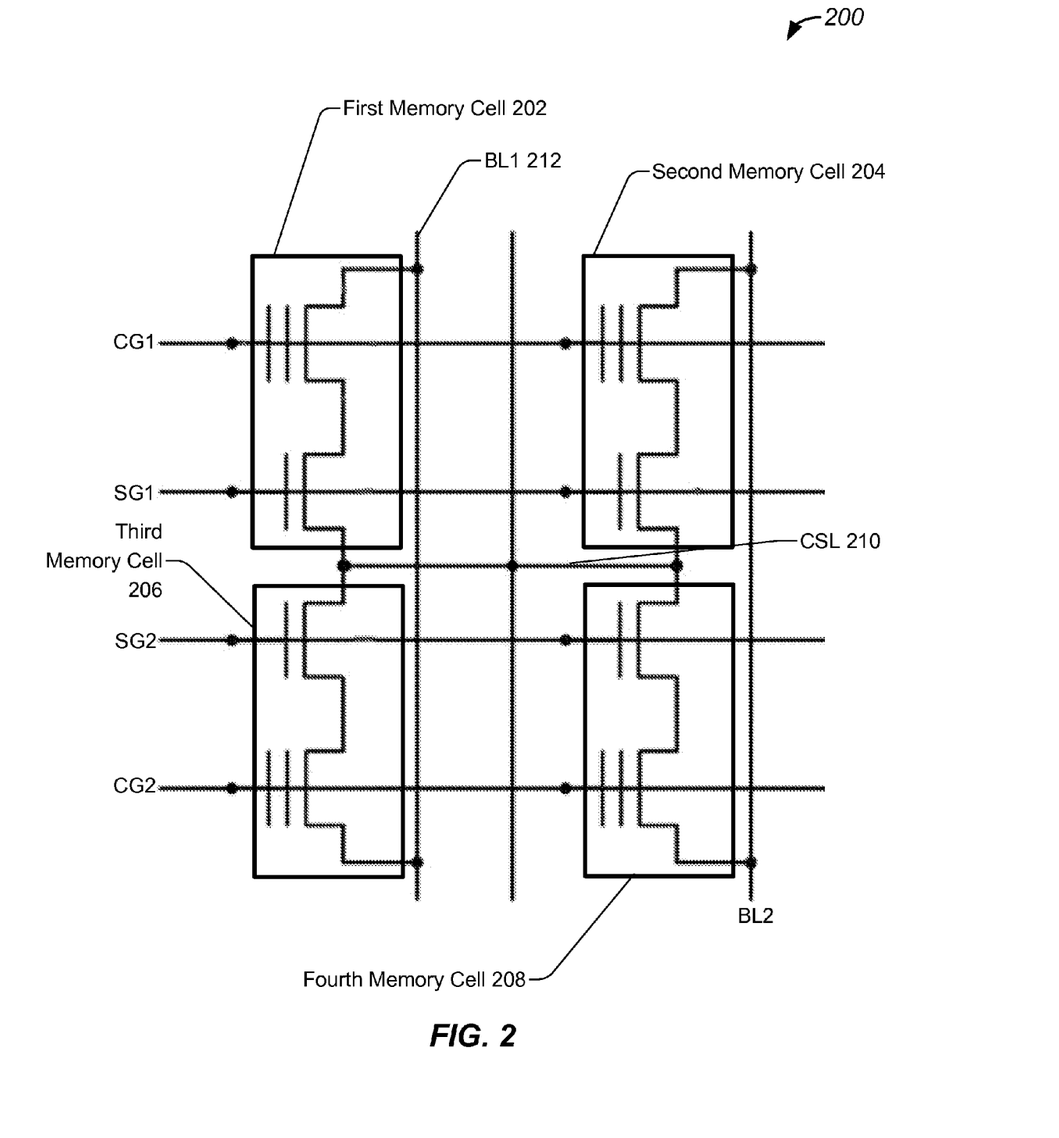
FIG. 2 illustrates a diagram of another example of a memory device, implemented in accordance with some embodiments.

FIG. 2 illustrates a diagram of another example of a memory device, implemented in accordance with some embodiments. As similarly discussed above with reference to FIG. 1, memory device 200 may include various memory cells such as first memory cell 202, second memory cell 204, third memory cell 206, and fourth memory cell 208. As similarly discussed above, one or more memory cells included in memory device 200 may share a source line. In this example, common source line 210 may be shared among adjacent columns of memory cells. For example, common source line 210 may be implemented between a first column of memory cells that includes first memory cell 202 and third memory cell 206, and a second column of memory cells that includes second memory cell 204 and fourth memory cell 208. When implemented in this way, the footprint of each memory cell may be reduced when compared to a conventional dedicated source line architecture. Common source lines may be implemented in a vertical or "y" direction as well as the horizontal or "x" direction described above with reference to FIG. 1.

Figure 3:
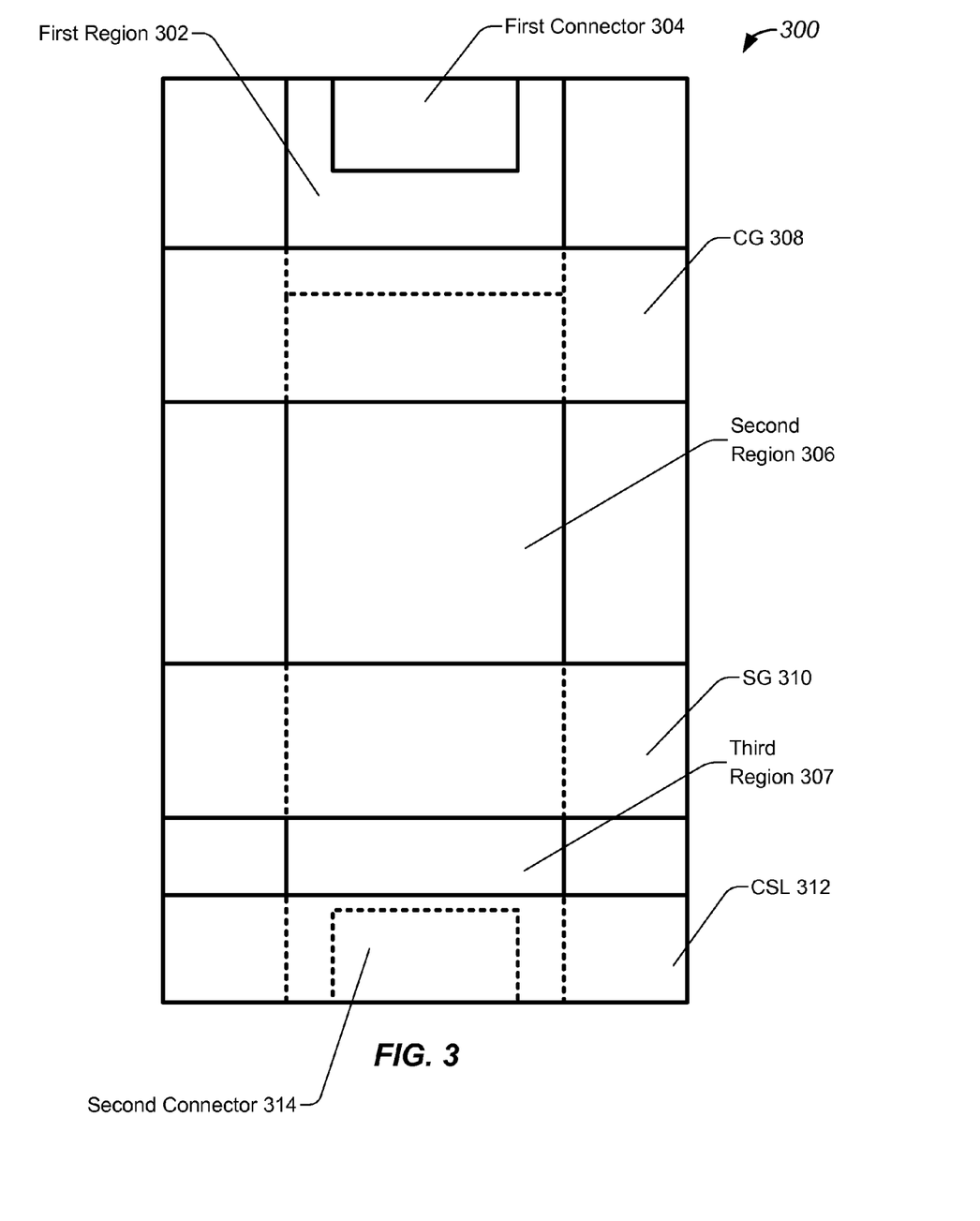
FIG. 3 illustrates an example of a layout of a memory cell, implemented in accordance with some embodiments.

FIG. 3 illustrates an example of a layout of a memory cell, implemented in accordance with some embodiments. As similarly discussed above, a memory cell, such as memory cell 300, may be implemented that has a common source line that runs along a horizontal or "x" direction. Accordingly, FIG. 3 illustrates a top view of a layout which may be used to fabricate a memory cell as disclosed herein. Thus, according to some embodiments, memory cell 300 may include first region 302 which may be a portion of the memory cell that is coupled to a bit line via first connector 304. While not shown in FIG. 3, the bit line may run vertically in the "y" direction and may be implemented above and parallel to memory cell 300. In some embodiments, first region 302 may be a drain or a p-well implemented in a substrate. Memory cell 300 may further include second region 306 which may be an active region of memory cell 300. Memory cell 300 may also include first line 308 which may be a control gate line (CG) coupled to a first gate which may be a control gate associated with a first transistor implemented in second region 306 and/or first region 302. As similarly discussed above, the first transistor may be a SONOS transistor configured to store one or more data values. Memory cell 300 may further include second line 310 which may be a select gate line (SG) coupled to a select gate associated with a select transistor implemented within second region 306 and/or third region 307, which may extend underneath second line 310 and be coupled to second region 306. In various embodiments, the bit line, first line 308, second line 310, and common source line 312 may be made of a conductive material such as a metal or an alloy. For example, the lines may be made of aluminum, copper, titanium, or their alloys as well as associated barrier/cap layers.

In various embodiments, memory cell 300 may further include second connector 314 which may couple third region 307 to common source line 312. In various embodiments, common source line 312 may run horizontally in the x direction of an array of memory cells and may be shared among a particular row of memory cells. In this way, no source line is implemented in the vertical or "y" direction, and the layout is significantly thinner in the x direction. In some embodiments, memory cell 300 is up to 50% thinner in the x direction when compared to a conventional dedicated source line architecture because no vertical dedicated source line is implemented.

Figure 4:
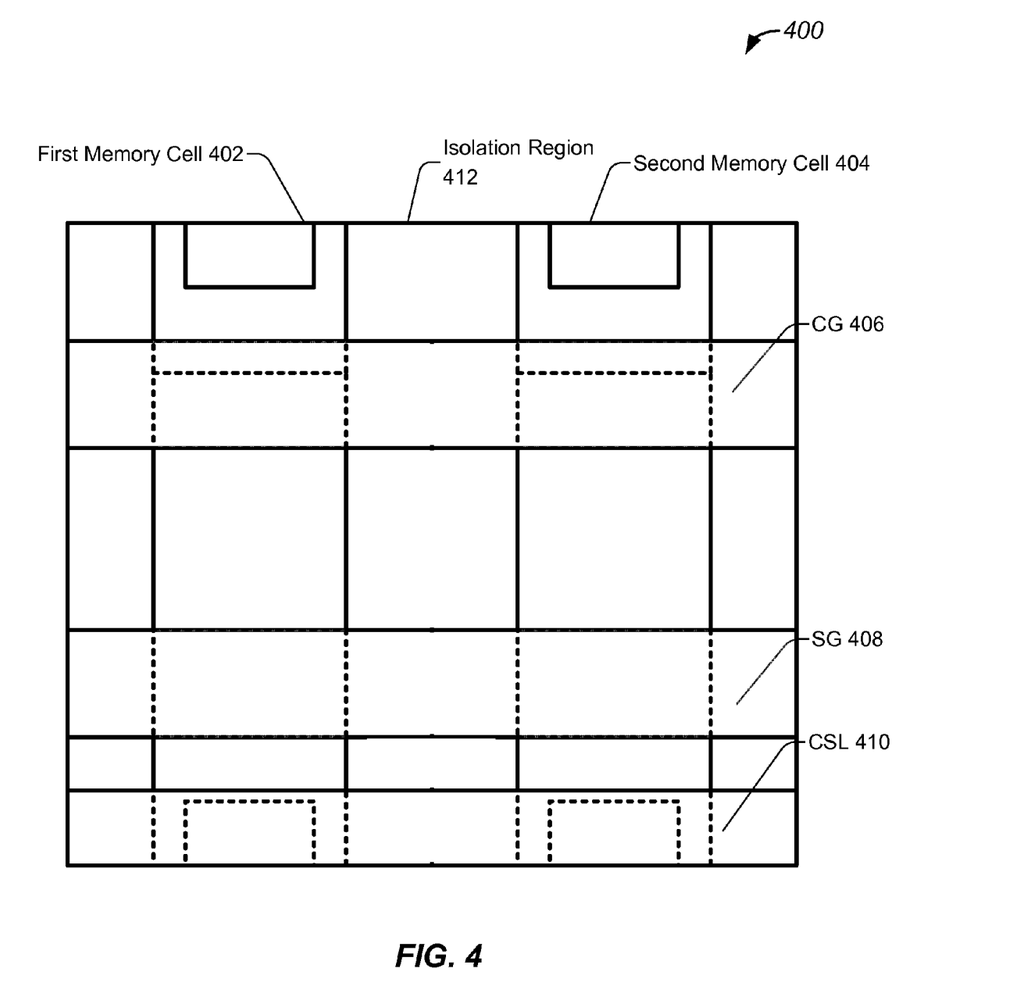
FIG. 4 illustrates an example of a layout of several memory cells, implemented in accordance with some embodiments.

FIG. 4 illustrates an example of a layout of several memory cells, implemented in accordance with some embodiments. As shown in FIG. 4, a memory device such as memory device 400 may include several memory cells implemented with a layout similar to that described above with reference to FIG. 3. Accordingly, memory device 400 may include first memory cell 402 and second memory cell 404 which may be implemented in the same row, but in different columns of a memory cell array. The adjacent memory cells may share connectivity with first line 406 and second line 408 which may be a control gate line (CG) and a select gate line (SG) respectively. Furthermore, adjacent memory cells such as first memory cell 402 and second memory cell 404 may both be coupled with common source line 410 which runs horizontally in the "x" direction across memory device 400. As shown in FIG. 4, because common source line 410 has been implemented horizontally, no additional source line is implemented in isolation region 412 between first memory cell 402 and second memory cell 404, thus reducing the overall horizontal width or dimension of the memory cells and the memory cell array.

Figure 5:
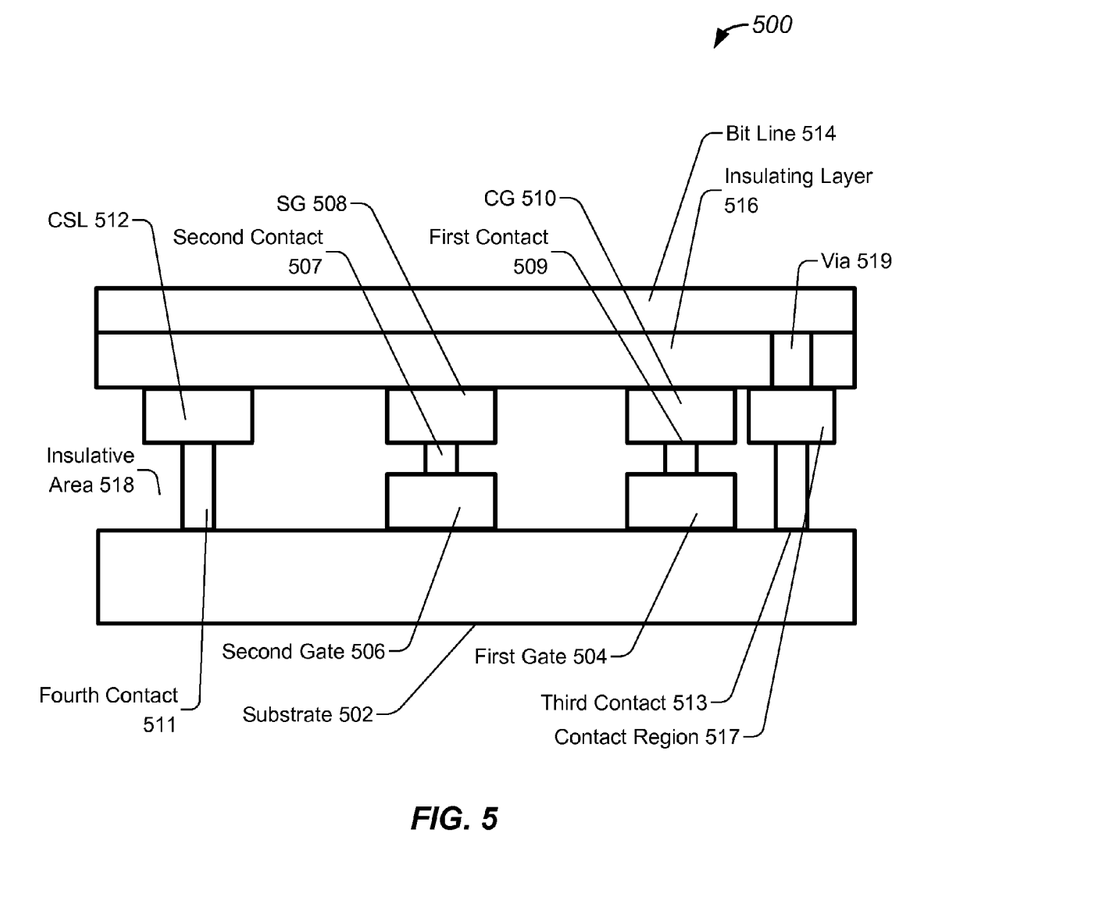
FIG. 5 illustrates an example of a cross-section of a layout of a memory cell, implemented in accordance with some embodiments.

FIG. 5 illustrates an example of a cross-section of a layout of a memory cell, implemented in accordance with some embodiments. As shown in FIG. 5, a memory cell such as memory cell 500 may include substrate 502, as well as first gate 504 which may be a control gate and second gate 506 which may be a select gate. As similarly discussed above with reference to FIGS. 1-4, the gates may be associated with transistors implemented within memory cell 500. In some embodiments, the gates may be coupled to lines configured to apply or provide voltages to the gates. For example, first gate 504 may be coupled to first line 510 which may be a control gate line (CG). In some embodiments, first gate 504 may optionally be coupled to first line 510 through first contact 509. Furthermore, second gate 506 may be coupled to second line 508 which may be a select gate line (SG). In some embodiments, second gate 506 may optionally be coupled to second line 508 through second contact 507.

Furthermore, a first portion of substrate 502 may be coupled to bit line 514 through third contact 513, which may include contact region 517, and via 519. Moreover, a second portion of substrate 502 may be coupled to common source line 512 through fourth contact 511. As shown in FIG. 5, common source line 512 extends in a "z" direction relative to a horizontal "x" direction and a vertical "y" direction of FIG. 5. Thus, common source line 512 extends to and is coupled with other memory cells included in a row of memory cells that includes memory cell 500. In various embodiments, bit line 514 and common source line 512 are separated by insulating layer 516, which may be an oxide or dielectric layer. Furthermore, area 518 may comprise any suitable insulative material that may provide electrical isolation between different components of memory cell 500.

Figure 6:
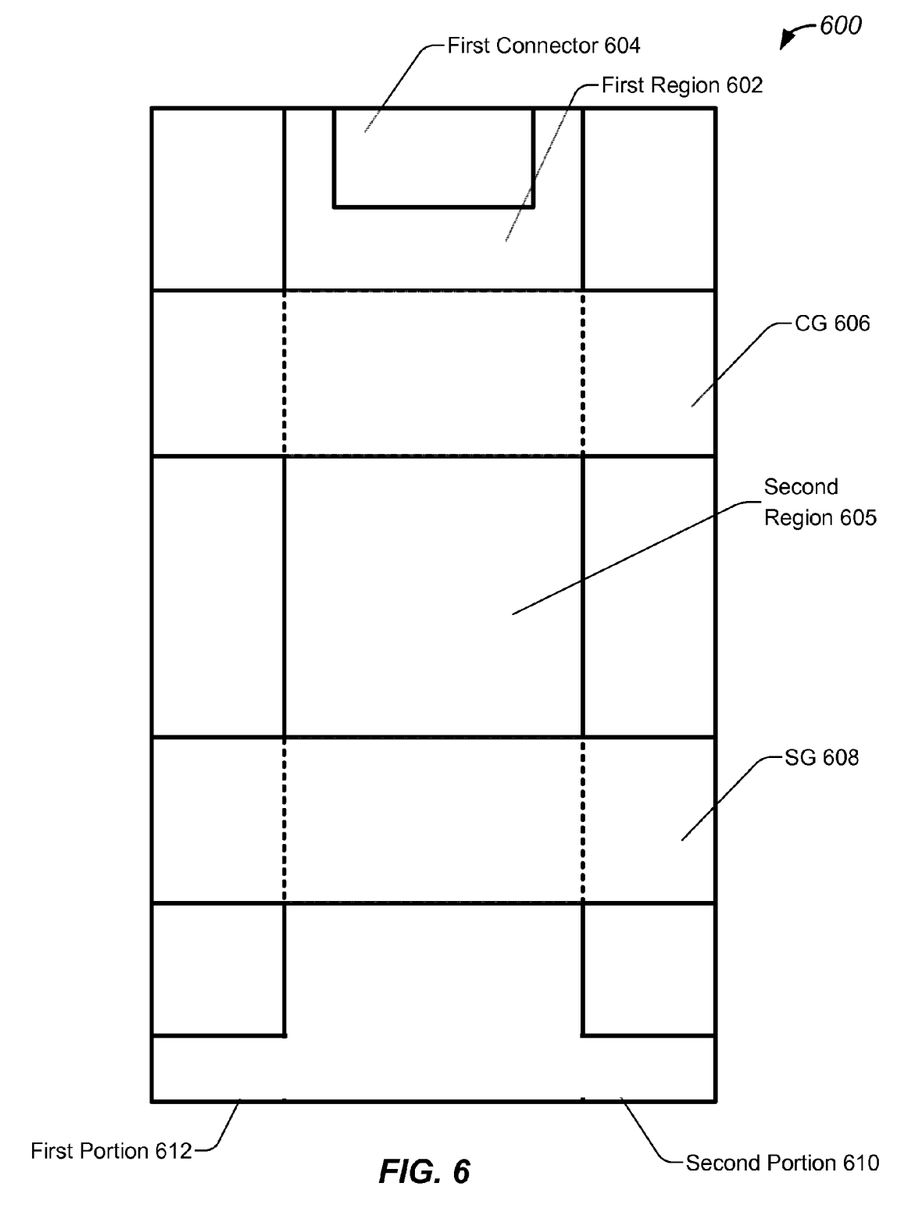
FIG. 6 illustrates another example of a layout of a memory cell, implemented in accordance with some embodiments.

FIG. 6 illustrates another example of a layout of a memory cell, implemented in accordance with some embodiments. As similarly discussed above with reference to FIG. 3, memory cell 600 may include first region 602 which may be a portion of the memory cell that is coupled to a bit line via first connector 604. Memory cell 600 may further include second region 605 which may be an active region of memory cell 600. Memory cell 600 may also include first line 606 which may be a control gate line (CG) coupled to a first gate which may be a control gate associated with a first transistor. As similarly discussed above, the first transistor may be a SONOS transistor configured to store one or more data values in a memory device. Memory cell 600 may further include second line 608 which may be a select gate line (SG) coupled to a select gate associated with a select transistor implemented within second region 605. In various embodiments, the bit line, first line 606, and second line 608 may be made of a conductive material such as a metal or an alloy. For example, the lines may be made of copper, titanium, or their alloys.

According to various embodiments, memory cell 600 might not include a separate line made of metal for a common source line. In some embodiments, one or more portions of an active region may be configured to provide a conductive path that functions a common source line among memory cells in a row of a memory cell array. For example, first portion 612 and second portion 610 may be configured to be diffusion regions that may provide a conductive path between adjacent memory cells. This diffusion region may, for example, be covered with metal silicide such as titanium silicide, cobalt silicide, or nickel silicide which may provide a conductive path between adjacent memory cells. In this way, a memory cell may be made significantly smaller because a common source line as disclosed hererin may be included in first portion 610 and second portion 612, and does not need a contact in every memory cell.

Figure 7:
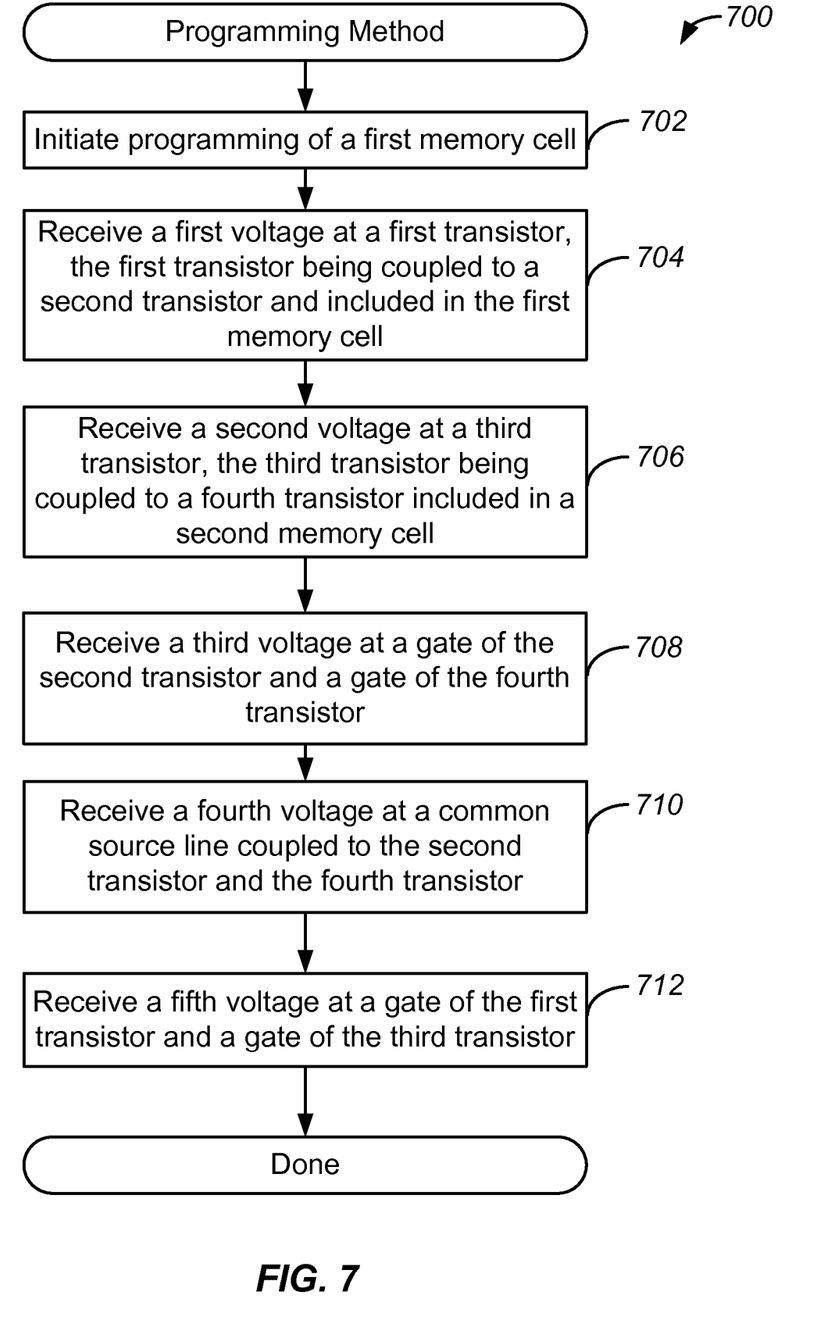
FIG. 7 illustrates a flow chart of an example of a programming method, implemented in accordance with some embodiments.

FIG. 7 illustrates a flow chart of an example of a programming method, implemented in accordance with some embodiments. As similarly discussed above, a memory device may include various memory cells. For example, the memory cells may be arranged in an array as rows and columns. Accordingly, a memory device may have at least a first memory cell included in a first column, and a second memory cell which may be included in a second column adjacent to the first column. The first and second memory cells may be configured as described above with reference to FIGS. 1-6. Accordingly, the first memory cell may include a first transistor and a second transistor coupled in series. Moreover, the second memory cell may include a third transistor and a fourth transistor coupled in series. As similarly discussed above, the first memory cell and the second memory cell may share a common source line. In various embodiments, programming method 700 may be implemented to select a memory cell and program the memory cell in accordance with a Fowler-Nordheim tunneling programming technique.

Accordingly, method 700 may commence with operation 702 during which programming of the first memory cell may be initiated. In various embodiments, programming of the first memory cell may be part of a write operation in which data is being written to memory. Thus, in response to a write operation which may be issued or handled by a memory controller associated with the memory device, one or more data values may be written to the memory device, which may include the first and second memory cells. Accordingly, the write operation as well as a separate memory associated with the memory controller may include one or more parameters or data that identify or select memory cells to be written to, data values to be written to the selected memory cells, and a sequence of operations to be performed to program the selected memory cells in accordance with the write operation. For example, the write operation may indicate that the first memory cell should be programmed, and software or firmware associated with the memory controller may be configured to specify a sequence of voltages to be applied to program the first memory cell.

Method 700 may proceed to operation 704 during which a first voltage may be received at a first transistor. As similarly discussed above, according to various embodiments, the first transistor may include a memory element or charge storage layer and may be included in a first memory cell. Accordingly, the first transistor may be coupled to a second transistor, which may be a select transistor, and together the first and second transistors may form the first memory cell. In various embodiments, the first voltage may be applied by a first voltage source via a conductive path, such as a first bit line. In some embodiments, the first bit line may be coupled to all memory cells in a first column of memory cells that includes the first memory cell. Accordingly, the first voltage source may be configured to bias the bit line, and may apply the first voltage to, for example a drain of the first transistor, via the bit line. Similarly, the first voltage may be applied to all other memory cells included in the first column. In various embodiments, the amplitude of the first voltage applied by the first voltage source may be between −0.5V and −5V. For example, the first voltage may be about −3.5V. As will be discussed in greater detail below, the amplitude of the first voltage may be determined based on a potential difference between the first voltage and another voltage applied to a gate of the first transistor. In some embodiments, a p-well that includes the memory cells may also be biased with the first voltage.

Method 700 may proceed to operation 706 during which a second voltage may be received at a third transistor. In some embodiments, the third transistor may also include a memory element and may be included in a second memory cell. Accordingly, the third transistor may be coupled to a fourth transistor, which may be a select transistor, and together the third and fourth transistors may form the second memory cell. In some embodiments, the second voltage may be applied by a second voltage source via a conductive path, such as a second bit line. Accordingly, the second voltage source may be configured to bias the second bit line, and may apply the second voltage to third transistor via the second bit line. As similarly discussed above, the second memory cell may be included in a second column of memory cells that is adjacent to the first column of memory cells. Accordingly, the second bit line may be coupled to and configured to bias all memory cells included in the second column of memory cells. In various embodiments, the amplitude of the second voltage applied by the second voltage source may be between about 0.5V and 5V. For example, the second voltage may be about 1V. Accordingly, as will be discussed in greater detail below, the amplitude of the second voltage source may be different than the amplitude of the first voltage source, as may be determined based on one or more parameters of the programming instructions associated with programming method 700. For example, if the second column is not to be written to and is not selected, the amplitude of the second voltage source may be set as described above. In some embodiments, the amplitudes of the first voltage and the second voltage may depend on the data to be written into the memory cells. For example, if the first memory cell is not to be programmed, while the second memory cell is to be programmed then the first voltage may be between about 0.5V and 5V and the second voltage may be between −0.5V and −5V.

Method 700 may proceed to operation 708 during which a third voltage may be received at a gate of the second transistor and a gate of the fourth transistor. As previously discussed, the second transistor and the fourth transistor may be select transistors included in the first and second memory cells, respectively. In various embodiments, during operation 708 a third voltage may be applied to and received at the gate of each of the second and fourth transistor via the same conductive pathway or line. In some embodiments, the amplitude of the third voltage may be configured to minimize the amount of current generated by each of the second and fourth transistors, and maintain an "off" state of each of the select transistors during programming. In this way, the bias provided by the third voltage may minimize the current leakage which may occur and may ensure that programming of the first transistor of the first memory cell may be performed using Fowler-Nordheim tunneling-based programming. In some embodiments, the sequence of operations may be different from the sequence shown in FIG. 7. For example, the third voltage received at the gates of the second and fourth transistors may be applied initially while the first and second voltages may be applied simultaneously and subsequently.

In some embodiments, the third voltage may have an amplitude of between about −0.5V to −5V, and may be applied to the gate of each of the second and fourth transistors. For example, the amplitude of the third voltage may be about −3.5V. When biased in this way, each of the select transistors may be "off" and may be minimally conductive. Accordingly, a current conducted by each of the second and fourth transistors, which may include a leakage current, may be minimized and a Fowler-Nordheim programming technique may be implemented to program the memory cells using relatively low voltages, as will be discussed in greater detail below. As previously discussed, one or more physical characteristics of the select gates themselves may be configured to further reduce the leakage current experienced during programming of the memory cells.

Method 700 may proceed to operation 710 during which a fourth voltage may be received at a common source line coupled to the second transistor and the fourth transistor. As previously discussed, a voltage may be received at the gates of the second and fourth transistors to keep them "off" during programming of the first memory cell. In some embodiments, a fourth voltage may be applied to the common source line itself to drive the common source line to a designated potential that further ensures that the second and fourth transistors are minimally conductive and remain "off." For example, the fourth voltage may have an amplitude of between about −0.5V and −5V. In some embodiments, the fourth voltage may have an amplitude of about −2V. It will be appreciated that operation 710 may be performed optionally, and in some embodiments is not performed.

Method 700 may proceed to operation 712 during which a fifth voltage may be received at a gate of the first transistor and a gate of the third transistor. Accordingly, during operation 712 a voltage may be applied to a control gate of the first transistor to apply a voltage sufficient to program the memory element and induce a change in its electrical properties or characteristics. In some embodiments, the amplitude of the fifth voltage may be sufficient to induce Fowler-Nordheim tunneling, thus programming the memory element using a Fowler-Nordheim tunneling-based technique, and changing one or more electrical properties of the memory element or charge storage layer included in the first transistor. As similarly discussed above, such a technique may be performed using relatively low voltages compared with other techniques, such as channel hot electron programming. The Fowler-Nordheim programming technique is also advantageous in because it uses significantly less power when compared to conventional techniques, such as channel hot electron programming. In some embodiments, the amplitude of the fifth voltage may be between about 2V and 7V. For example, the amplitude of the fifth voltage may be about 4V.

In various embodiments, the amplitude of the fifth voltage is determined based on the amplitude of the first voltage. For example, the amplitudes of the first voltage applied to the drain of the first transistor and the fifth voltage applied to the gate of the first transistor may be configured such that a difference between the two voltages is a predetermined or designated amount. Thus, the voltages may be configured to have a difference of between about 4V and 12V. More specifically, the difference may be between about 6V and 9V. In one example, the difference between the first voltage and the fifth voltage may be about 7.5V. In this example, the first voltage may have an amplitude of about −3.5V while the fifth voltage has an amplitude of about 4V. In some other embodiments, it may be advantageous to use a single voltage between about 4V and 12V, such as about 7.5V, instead of splitting the voltages into positive and negative voltages. Accordingly, programming of the first memory cell may occur with a relatively small voltage difference, especially when compared to other conventional techniques which may require voltage differences in excess of 14V. In this way, programming of a memory cell may be performed that utilizes a common source line, thus enabling small area implementations of memory cells that have a low power consumption when implemented in such small area implementations.

While method 700 has been described above with reference to a first memory cell, such a programming method may be applied to any memory cell within the memory cell array in any suitable order. Moreover, the description of operations 704-712 included above is provided as an example of programming method 700, and various other embodiments of programming method 700 may perform operations 704-712 in any suitable order.

Figure 8:
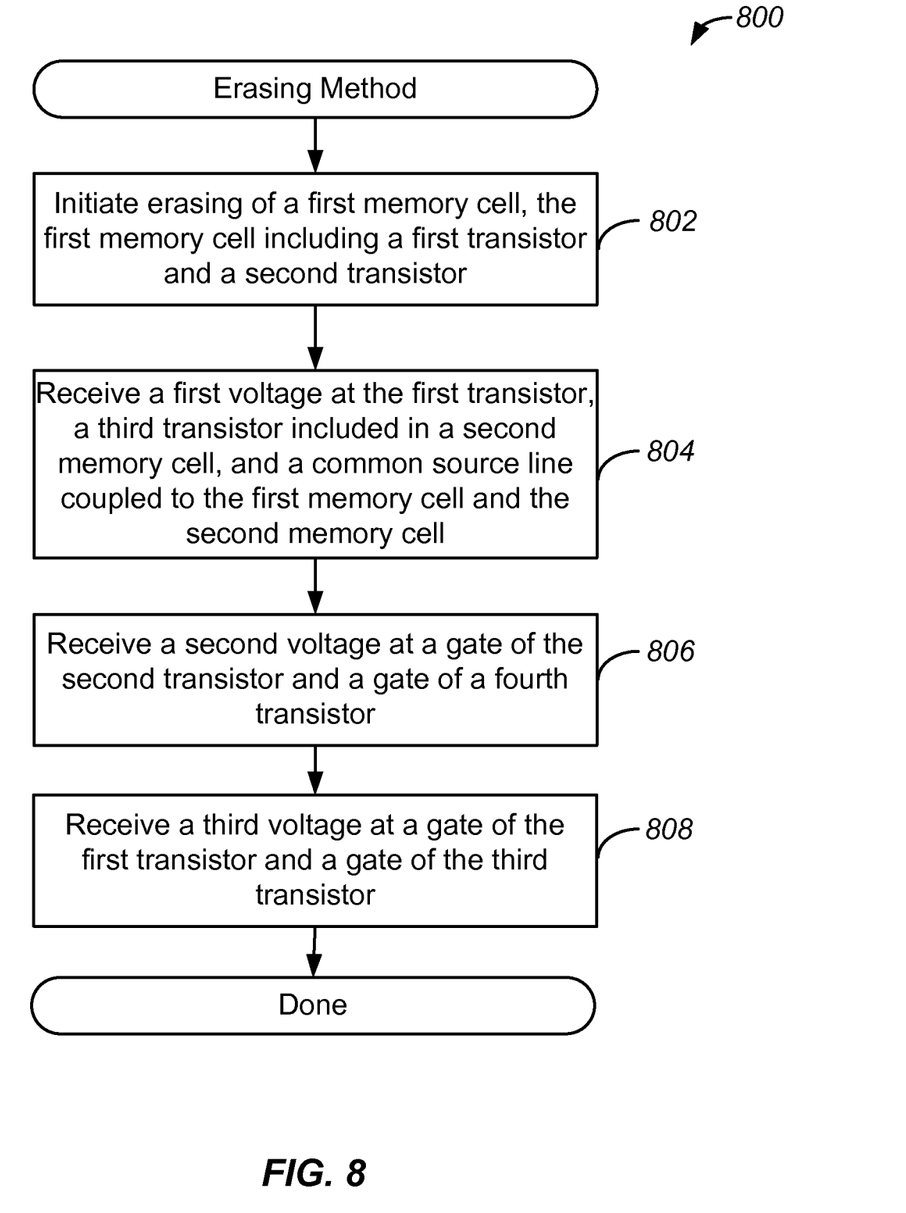
FIG. 8 illustrates a flow chart of an example of an erasing method, implemented in accordance with some embodiments.

FIG. 8 illustrates a flow chart of an example of an erasing method, implemented in accordance with some embodiments. As similarly discussed above with reference to FIG. 7, a memory device may include various memory cells that may be arranged in an array as rows and columns. Accordingly, a memory device may have at least a first memory cell included in a first column, and a second memory cell which may be included in a second column adjacent to the first column. The first and second memory cells may be configured as described above with reference to FIGS. 1-6. Accordingly, the first memory cell may include a first transistor and a second transistor coupled in series. Moreover, the second memory cell may include a third transistor and a fourth transistor coupled in series. As similarly discussed above, the first memory cell and the second memory cell may share a common source line. In various embodiments, erasing method 800 may be implemented to erase a data value stored in a memory cell.

Accordingly, method 800 may commence with operation 802 during which erasing of the first memory cell may be initiated. In various embodiments, erasing of the first memory cell may be part of an erase operation issued or handled by a memory controller associated with the memory device that includes the first and second memory cells. Accordingly, the erase operation as well as a separate memory associated with the memory controller may include one or more parameters or data that identify or select memory cells to be erased, and a sequence of operations to be performed to erase the selected memory cells in accordance with the erasing operation. For example, the erasing operation may indicate that the first memory cell should be erased, and software or firmware associated with the memory controller may be configured to specify a sequence of voltages to be applied to erase the first memory cell.

Method 800 may proceed to operation 804 during which a first voltage may be received at the first transistor, the third transistor, and the common source line coupled to the first memory cell and the second memory cell. According to some embodiments, the first voltage may be applied to a first bit line associated with the first memory cell and a second bit line associated with the second memory cell. Thus, the first voltage may be received at a drain and also the p-well of the first transistor and the third transistor. Moreover, the first voltage may also be applied to the common source line, which is also coupled to the sources of the second and fourth transistors. In this way, the drains of the first and third transistors as well as the sources of the second and fourth transistors may be driven to a single potential or voltage. In some embodiments, the first voltage may have an amplitude of between about 2V and 6V. For example, the first voltage may have an amplitude of about 4V.

Method 800 may proceed to operation 806 during which a second voltage may be received at a gate of the second transistor and a gate of a fourth transistor. Thus, the gates of the second transistor and the fourth transistors which may be the select gates of the first and second memory cells, respectively, may receive a second voltage which may be between about 0V and 4V. For example, the second voltage may have an amplitude of about 1V.

Method 800 may proceed to operation 808 during which a third voltage may be received at a gate of the first transistor and a gate of the third transistor. Accordingly, a third voltage may be applied to erase the selected first memory cell. In various embodiments, the third voltage may have an amplitude that is determined or configured based on the amplitude of the first voltage. For example, the first and third voltage may be configured to have an amplitude that is equal to but of opposite polarity to a voltage difference utilized during a programming method. Thus, the difference between the first voltage and the third voltage may be between about 4V and 12V. For example, the difference may be about 7.5V. However, as contrasted to the programming method, the polarity of the difference may be opposite, and a voltage of between about −2V and −6V may be received at the gate of the first transistor. For example, the third voltage may have an amplitude of about −3.5V. When the first memory cell receives the previously described voltages in this way, a change in the electrical properties of the memory element that may have occurred during a previous programming method may be reversed and consequently erased.

Figure 9:
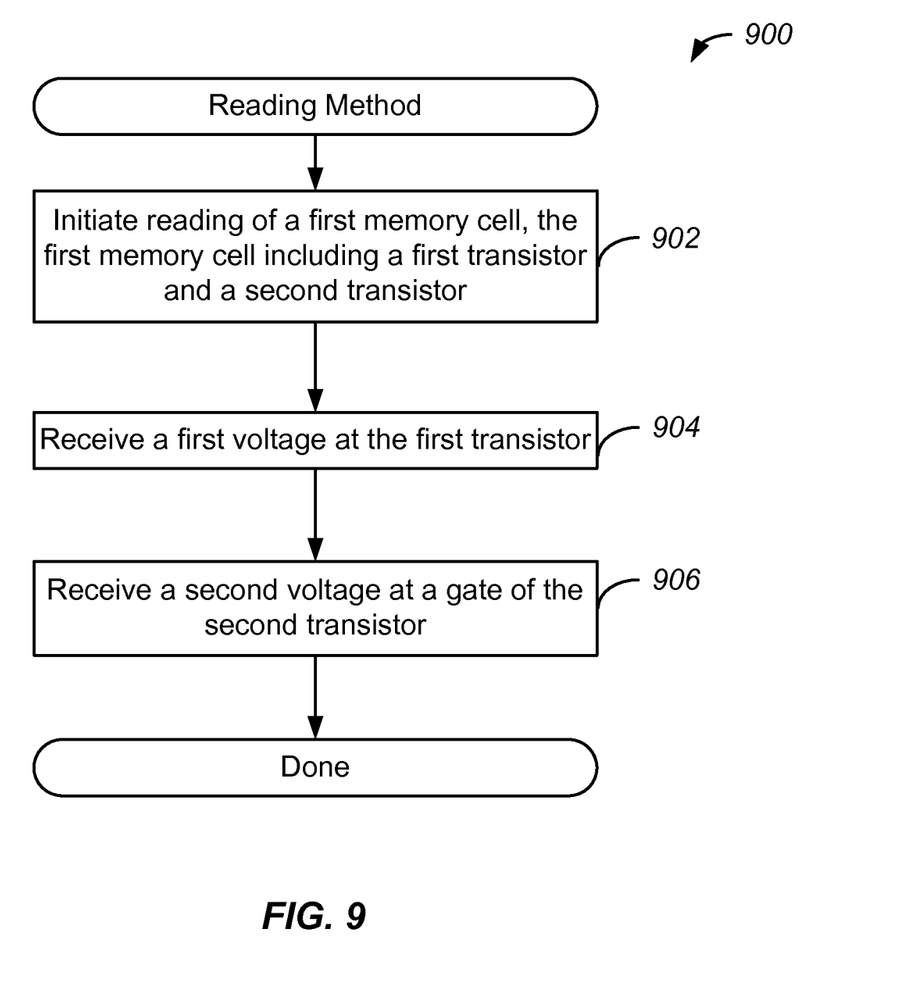
FIG. 9 illustrates a flow chart of an example of a reading method, implemented in accordance with some embodiments.

FIG. 9 illustrates a flow chart of an example of a reading method, implemented in accordance with some embodiments. As similarly discussed above with reference to FIGS. 7 and 8, a memory device may include various memory cells such as a first memory cell included in a first column, and a second memory cell which may be included in a second column adjacent to the first column. The first and second memory cells may be configured as described above with reference to FIGS. 1-6. Accordingly, the first memory cell may include a first transistor and a second transistor coupled in series. Moreover, the second memory cell may include a third transistor and a fourth transistor coupled in series. As similarly discussed above, the first memory cell and the second memory cell may share a common source line. In various embodiments, reading method 900 may be implemented to read a data value that may be stored in a memory cell.

Accordingly, method 900 may commence with operation 902 during which reading of the first memory cell may be initiated. In various embodiments, reading of the first memory cell may be part of a read operation issued or handled by a memory controller associated with the memory device that includes the first and second memory cells. Accordingly, the read operation as well as a separate memory associated with the memory controller may include one or more parameters or data that identify or select memory cells to be read, and a sequence of operations to be performed to read the selected memory cells in accordance with the read operation. For example, the read operation may indicate that the first memory cell should be read, and software or firmware associated with the memory controller may be configured to specify a sequence of voltages to be applied to read the first memory cell.

Method 900 may proceed to operation 904 during which a first voltage may be received at the first transistor. In various embodiments, the first voltage may be applied to a first bit line that is coupled to a drain or p-well of the first transistor. Accordingly, the first transistor may be biased to a slightly positive voltage, such as between about 0.3V and 1.5V. For example, the first voltage may have an amplitude of about 0.6V.

Method 900 may proceed to operation 906 during which a second voltage may be received at a gate of the second transistor. As previously discussed, the second transistor may be the select transistor of the first memory cell. Accordingly, the gate of the second transistor may be biased to a voltage which may be between about 1V and 4V. For example, the gate of the second transistor may be biased to about 2.5V. When biased in this way, a relatively small current may pass through the first transistor and may be read by one or more components included in or associated with the memory device, such as a memory controller. In various embodiments, the electrical properties of the memory element affect the amplitude of the signal or measured current. Accordingly, the state of the memory element may be inferred based on the amplitude of the current. Furthermore, while reference has been made herein to a current measurement, it will be appreciated that a voltage measurement may be used as well.

Figure 10:
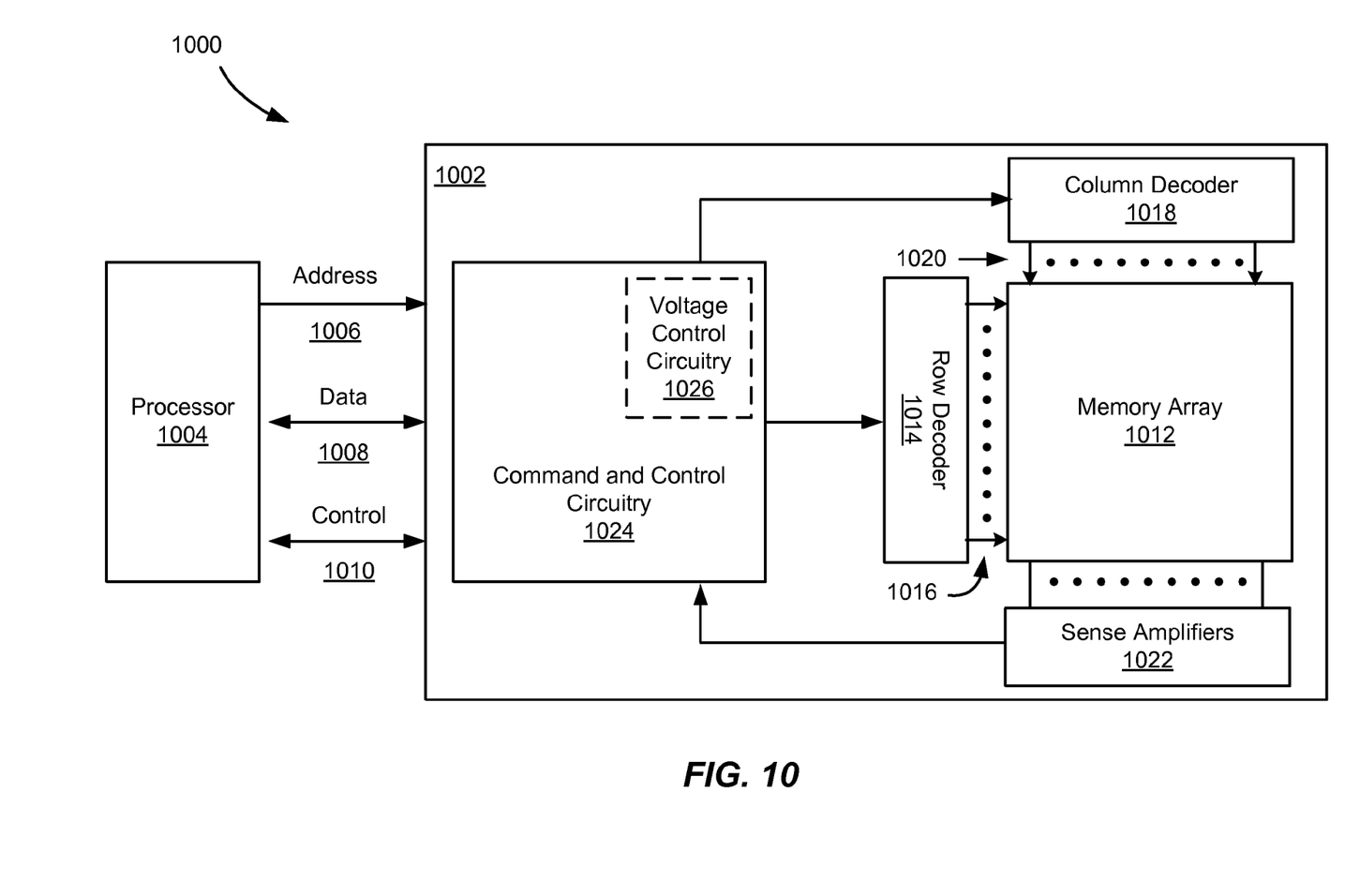
FIG. 10 illustrates a block diagram of a processing system including a memory device, implemented in accordance with some embodiments.

FIG. 10 illustrates a block diagram of a processing system including a memory device, implemented in accordance with some embodiments. Processing system 1000 generally includes non-volatile memory 1002 coupled to processor 1004 in a conventional manner via address bus 1006, data bus 1008, and control bus 1010. It will be appreciated by those skilled in the art that the processing system of FIG. 10 has been simplified for the purpose of illustrating the present invention and is not intended to be a complete description. In particular, details of the processor, row and column decoders, sense amplifiers and command and control circuitry, which are known in the art have are not described in detail herein.

Processor 1004 may be a type of general purpose or special purpose processing device. For example, in one embodiment the processor can be a processor in a programmable system or controller that further includes a non-volatile memory, such as a Programmable System On a Chip or PSoC™ controller, commercially available from Cypress Semiconductor of San Jose, Calif.

Non-volatile memory 1002 includes memory array 1012 organized as rows and columns of non-volatile memory cells (not shown in this figure) as described above. Memory array 1012 is coupled to row decoder 1014 via multiple select lines and read lines 1016 (at least one select line and one read line for each row of the memory array). Memory array 1012 is further coupled to column decoder 1018 via multiple bit lines 1020 (one each for each column of the memory array) as described above. It will be appreciated that common source lines may be implemented as part of lines 1020 or lines 1016 as described above. Memory array 1012 may be coupled to a plurality of sense amplifiers 1022 to read multi-bit words therefrom. Non-volatile memory 1002 further includes command and control circuitry 1024 to control row decoder 1014, column decoder 1018, and sense amplifiers 1022, and to receive read data from sense amplifiers 1022. Command and control circuitry 1024 includes voltage control circuitry 1026 to generate the voltages needed for operation of non-volatile memory 1002, which may be routed through voltage control circuitry 1026 to row decoder 1014. Voltage control circuitry 1026 operates to apply appropriate voltages to the memory cells during read, erase and program operations.

Command and control circuitry 1024 may be configured to control row decoder 1014 to select a first row of memory array 1012 for a program operation by applying a voltage to a first select line in the first row and to deselect a second row of the memory array by applying another voltage to a second select line in the second row. Command and control circuitry 1024 may be further configured to control column decoder 1018 to select a memory cell in the first row for programming by applying a voltage to a first bit line in a first column, and to inhibit an unselected memory cell in the first row from programming by applying another voltage to a second bit line in a second column. Row decoder 1014 or column decoder 1018 may be further configured to apply a voltage to one or more common source lines that may be coupled to memory cells included in memory cell array 1012 as described above.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatus. Accordingly, the present examples are to be considered as illustrative and not restrictive.

What is claimed is:

1. An apparatus, comprising:
   a first cell including a first control gate and a first select gate;
   a second cell including a second control gate and a second select gate;
   a third cell including a third control gate and a third select gate;
   a fourth cell including a fourth control gate and a fourth select gate,
   wherein,
   the first, second, third, and fourth cells share a common source line,
   the first and second cells share a first select gate line and a first control gate line,
   the third and fourth cells share a second select gate line and a second control gate line,
   the first and third cells share a first bit line, and the second and the fourth cells share a second bit lines, and
   the first and second select gate lines and control gate lines, and the common source line extend perpendicularly to the first and second bit lines.

2. The apparatus of claim 1, wherein the first and second select gate lines and control gate lines, and the common source line are disposed on a same level.

3. The apparatus of claim 1, wherein the first and second bit lines are disposed on a same level, overlying the first and second select gate lines and control gate lines, and the common source line.

4. The apparatus of claim 2, wherein the common source line is electrically coupled to the first and third cells, and the second and fourth cells via first and second contacts, respectively.

5. The apparatus of claim 3, wherein the first bit line is electrically coupled to the first cell via a first via, a bit line contact region, and a bit line contact, and wherein the bit line contact region is disposed at the same level as the first and second select gate lines and control gate lines, and the common source line.

* * * * *